United States Patent [19]

Kuo et al.

[11] Patent Number: 5,060,028

[45] Date of Patent: Oct. 22, 1991

[54] HIGH BAND-GAP OPTO-ELECTRONIC DEVICE

[75] Inventors: Chih-Ping Kuo, Milpitas; Robert M. Fletcher; Timothy D. Osentowski, both of San Jose, all of Calif.

[73] Assignee: Hewlett-Packard Company, Palo Alto, Calif.

[21] Appl. No.: 300,003

[22] Filed: Jan. 19, 1989

[51] Int. Cl.$^5$ ............................................ H01L 33/00
[52] U.S. Cl. .......................................... 357/17; 357/4; 357/16; 357/90; 357/30; 372/43; 372/45
[58] Field of Search ................. 357/90, 30 A, 30 E, 357/30 B, 30 L, 16, 17, 4, 30 F; 372/43, 44, 45

[56] References Cited

U.S. PATENT DOCUMENTS

| | | | |
|---|---|---|---|
| 3,963,539 | 6/1976 | Kemlage et al. | 357/17 |
| 3,995,303 | 11/1976 | Nahory et al. | 357/30 E |
| 4,016,586 | 4/1977 | Anderson et al. | 357/30 E |
| 4,053,920 | 10/1977 | Enstrom | 357/30 E |
| 4,319,259 | 3/1982 | Ohsima et al. | 357/16 |
| 4,383,259 | 5/1983 | Capasso | 357/16 |
| 4,476,477 | 10/1984 | Capasso et al. | 357/30 A |
| 4,512,022 | 4/1980 | Tsang | 357/90 |
| 4,558,336 | 12/1985 | Chang et al. | 357/16 |
| 4,607,272 | 8/1986 | Osbourn | 357/16 |
| 4,719,155 | 1/1988 | Matsumoto | 357/30 E |
| 4,745,612 | 5/1988 | Hayakawa et al. | 357/90 |
| 4,819,036 | 4/1989 | Kuroda et al. | 357/30 E |
| 4,894,836 | 1/1990 | Hayakawa et al. | 357/17 |

FOREIGN PATENT DOCUMENTS

| | | | |
|---|---|---|---|
| 0213705 | 7/1986 | European Pat. Off. | |
| 54-146984 | 11/1979 | Japan | 357/16 |
| 0071191 | 5/1982 | Japan | 357/30 E |
| 60-214524 | 10/1985 | Japan | |
| 62-200784 | 9/1987 | Japan | |
| 1385634 | 2/1975 | United Kingdom | 357/16 |

OTHER PUBLICATIONS

Sakaguchi et al., "Room Temperature . . . Laser", Electronic Letters, 11/19/87, vol. 23, No. 24, pp. 1327-1328.
Ishikawa et al., "Room Temperature . . . Vapor Deposition", Appl. Phys. Lett., 1/20/86.
Nam et al., "Short-Wavelength . . . Heterostructures", Appl. Phys. Lett. 52 (16), 4/18/88.
Kuo et al., "Stimulated Emission . . . Heterostructures".
"Stimulated Emission in $In_{0.5}(Al_xGa_{1-x})_{0.5}P$ Quantum Well Heterostructures", C. P. Kuo, R. M. Fletcher, T. D. Osentowski & M. G. Craford, May 16–20, 1988.
"Short-Wavelength (625nm) Room-Temperature Continuous Laser Operation of $In_{0.5}Al_xGa_{1-x})_{0.5}P$ Quantum Well Heterostructures", D. W. Nam et al., *Appl. Phys. Lett. 52, (16), 18 Apr. 1988, pp. 1329–1331.*
"Room-Temperature cw Operation of InGaP/InGaAlP . . . Deposition", Ishikawa et al., *Appl. Phys. Lett 48 (3), 20 Jan. 1986, pp. 207–208.*
"A $GaAs_xP_{1-x}$/GaP Strained-Layer Superlattice", *Appl. Phys. Lett. 41(2), 15 Jul. 1982, pp. 172–174*, G. C. Osbourn et al.
"Reduction of Dislocation Density . . . by MOCVD", Nishimura et al., *Inst. Phys. Conf. Ser. No. 91:Chapter 3*, pp. 343–346.

(List continued on next page.)

*Primary Examiner*—Rolf Hille
*Assistant Examiner*—Minhloan Tran

[57] ABSTRACT

A high band-gap opto-electronic device is formed by epitaxially growing the device section in a lattice-matched $(Al_xGa_{1-x})_yIn_{1-y}P$-GaAs system. The band-gap of the epitaxial layer increases with x. Instead of growing the device section directly on the GaAs substrate, a layer of $(Al_xGa_{1-x})_yIn_{1-y}P$, graded in x and in temperature while maintaining substantially y=0.5, is grown as a transitional layer. The high band-gap device structures include homojunctions, heterojunctions and particularly a separate confinement quantum well heterostructures. Various embodiments of the invention include devices on absorbing substrates and on transparent substrates, and devices incorporating strained-layer superlattices.

15 Claims, 6 Drawing Sheets

OTHER PUBLICATIONS

"Room-Temperature Continuous-Wave Operation of a 640nm AlGaInP Visible-Light Semiconductor Laser", S. Kawata et al., *Electronics Letters,* 19th Nov. 1987, vol. 23, No. 24, pp. 1327-1328.

"AlGaInP Visible Semiconductor Lasers", Ikeda et al., Proc. Int. Symp. on Optical Memory, 1987, *Japanese Journal of Applied Physics,* vol. 26 ,(1987) Supplement 26-4, pp. 101-105.

G. C. Osbourne et al., A $GaAs_xP_{1-x}/GaP$ Strained-Layer Superlattice; *Appl. Phys. Lett.* 42(2), 15 Jul. 1982.

D. W. Nam et al., Short-Wavelength (−625 nm) Room-Temperature Continuous Laser Operation of $In_{0.5}(Al_xGa_{1-x})_{0.5}P$ Quantum Well Heterostructures; *Appl. Phys. Lett.* 52(16), 18 Apr. 1988.

H. Ishiguro et al., High Efficient GaAlAs Light-Emitting Diodes of 660 nm with a Double Heterostructure on a GaAlAs Substrate; *Appl. Phys. Lett.*, 43(11), 1 Dec. 1983.

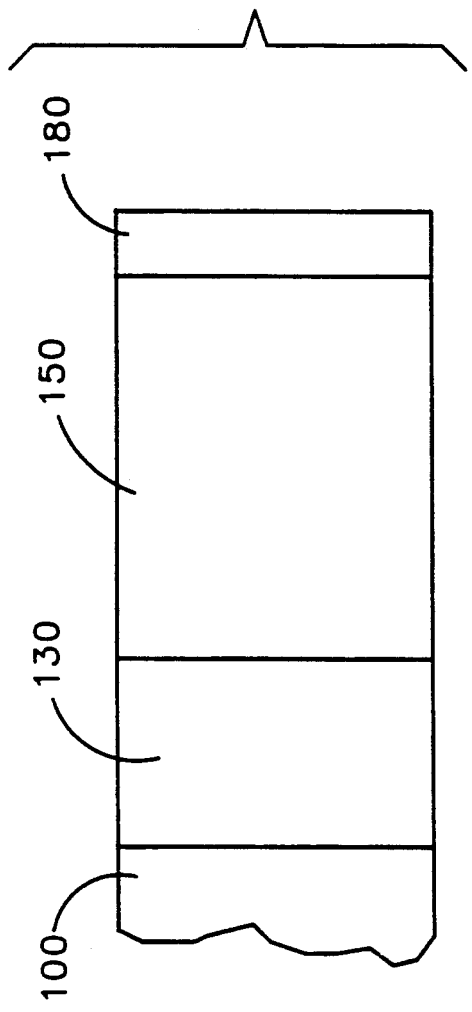
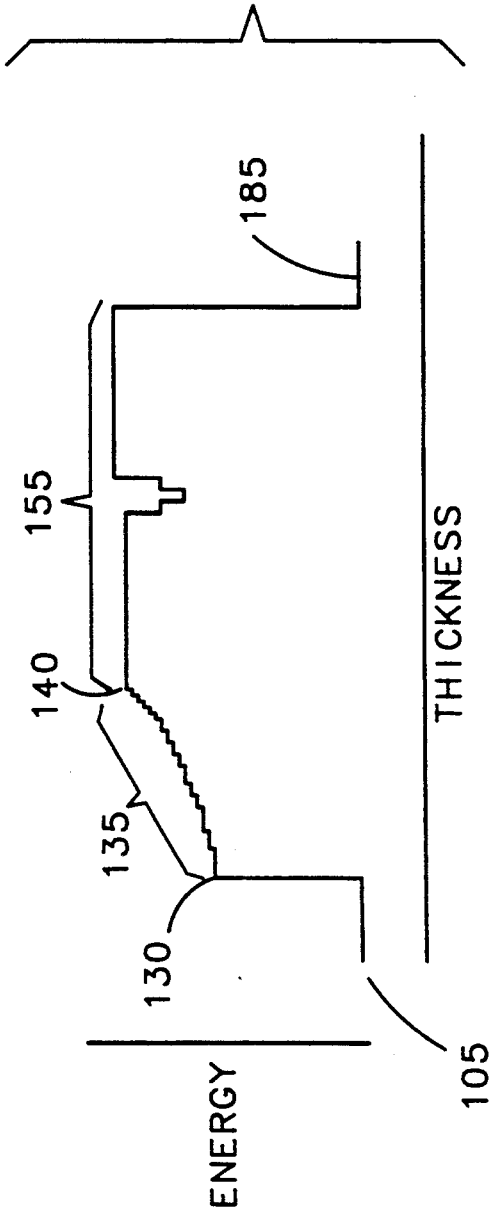

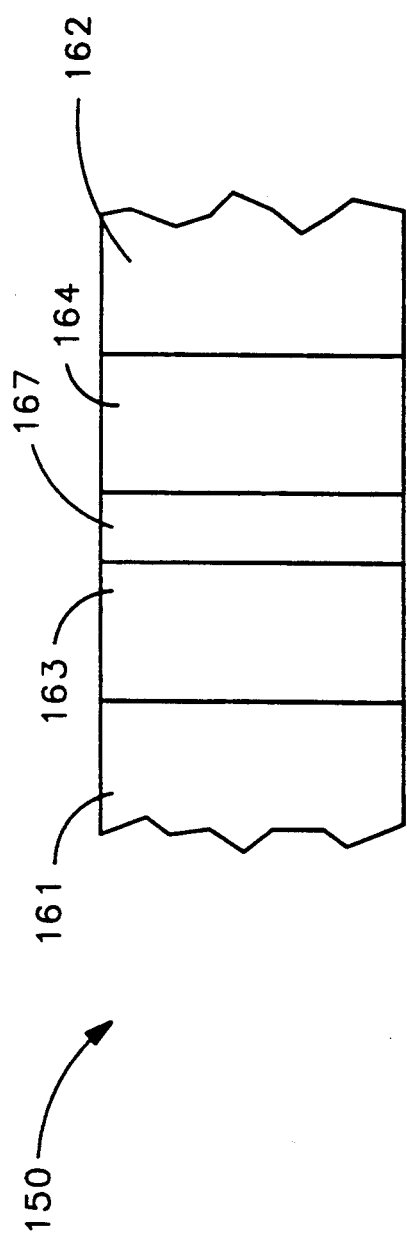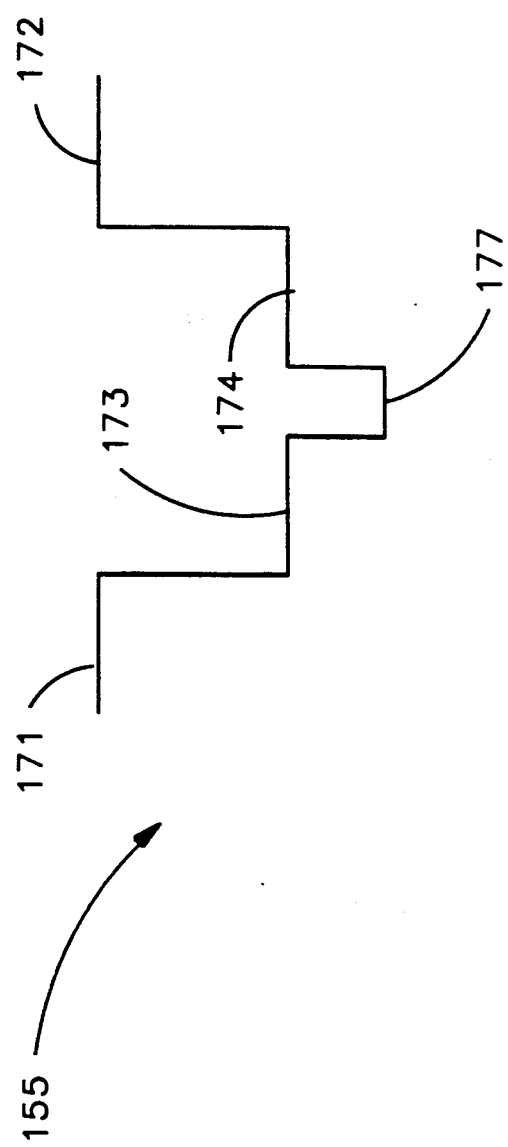

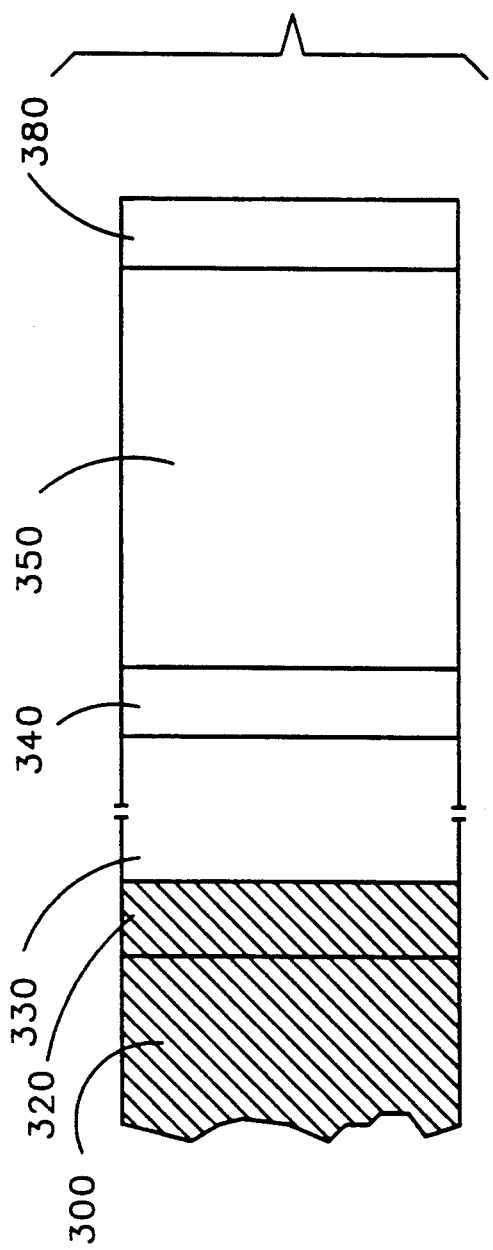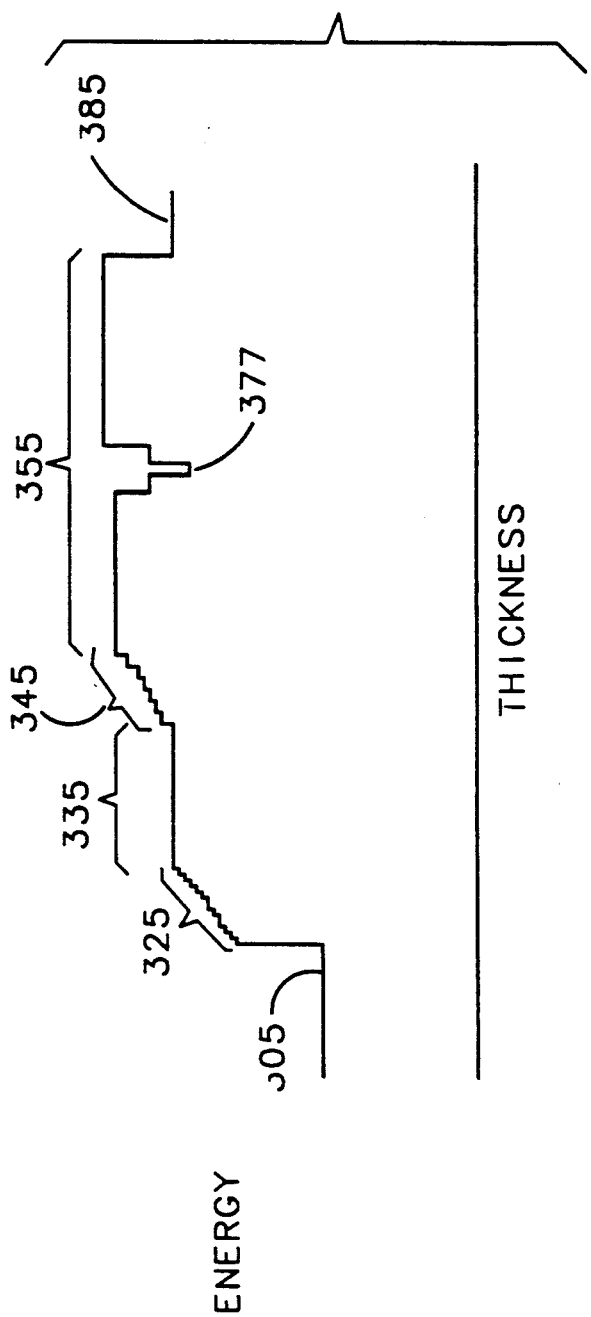

HIGH BAND-GAP OPTO-ELECTRONIC DEVICE

BACKGROUND OF THE INVENTION

This invention relates generally to opto-electronic semiconductor devices, and particularly, to a high band-gap quantum well heterostructure laser and a method of growing high band-gap semiconductor material.

An opto-electronic device serves to convert electric energy to light energy and vice-versa. It includes light emitting diodes (LEDs), laser emitters, photodetectors and photocells. In particular, LEDs are frequently used for displays and as indicators, and laser diodes, which may be regarded as a form of LED, are used as fiber-optic sources.

Various types of semiconductor LEDs are known. In most types of LEDs, a p-n junction semiconductor is employed. A potential difference is applied across the junction by means of a pair of electrodes in contact with the p-type and n-type regions. This causes electrons to be injected across the junction from the n-type region to the p-type region and causes holes to be injected across the junction from the p-type region to the n-type region. In the p-type region, the injected electrons recombine with the holes resulting in light emission; in the n-type region, the injected holes recombine with electrons resulting in light emission. The wavelength of the light emission depends on the energy generated by the recombination of electrons and holes which is determined by the band-gap of the p-n junction semiconductor material.

It is known in the art that the p-n junction may take on one of several forms. In the simplest form, a homojunction device is employed, where the p-type and the n-type regions are of the same band-gap energy. In improved LEDs, a single heterojunction device is employed, where the band-gap energy in the p-type region is different from that in the n-type region. This gives rise to the property that either electrons or holes, but not both, are injected across the junction. The injected electrons or holes then recombine to cause light emission in one region only. This region is commonly referred to as the active region. By concentrating the radiative recombinations in a smaller active region, a heterojunction device is more efficient than a homojunction device.

A device known as a double heterojunction LED further improves on the efficiency of single heterojunction LEDs. Typically, the active region is sandwiched by a pair of wider band-gap layers, one being of p-type and the other of n-type. Two heterojunctions are thus formed from the triple layers. The higher band-gap of the additional layer helps to confine the injected electrons within the smaller band-gap active layer. This allows for a much thinner active layer which minimizes re-absorption and increases light emission efficiency. Furthermore, the pair of higher band-gap layers also acts as cladding layers which provide optical confinement to further enhance light emission efficiency.

In the case of laser emitters, a device known as quantum well heterostructure (QWH) is highly efficient. A QWH may be regarded as a double heterostructure where the thickness of the active layer is reduced to the order of carrier de Broglie wavelength. In this case, the motion of the carriers assumes a quantum effect and behaves like a two-dimensional gas localized within the plane of the active layer. The 2D quantization results in a series of discrete energy levels given by the bound state energies of a finite square well. The corresponding density of states acquires a step-like function. In contrast, the density of states for the non-quantum counterpart is described by a parabolic function and diminishes to zero as the band edge is approached. QWH are advantageous in that they have higher emission efficiency, faster response time, lower threshold current and lower sensitivity to temperature variations.

The p- or n-type layers of various band-gaps are typically grown as epitaxial layers from the alloys of III-V compounds. One common compound, gallium arsenide (GaAs), readily yields high quality single crystals. However, it has a band-gap of 1.43 electron volts (eV) which corresponds to the infrared end of the light spectrum.

A wider band-gap material must be used to produce an LED with emission in the visible spectrum. For example, efficient red LEDs have been fabricated from aluminum gallium arsenide (AlGaAs) semiconductor material. AlGaAs is lattice-matched to GaAs. The band-gap energy of semiconductor material can be increased with substitution of aluminum atoms for gallium atoms. The greater the aluminum substitution in the resulting material, the higher is the band-gap. Aluminum is chosen to form the alloy because the varying concentration of aluminum does not substantially affect the lattice constant, and this property allows successive epitaxial layers of lattice-matched AlGaAs to be grown easily.

Typically, to minimize re-absorption, the band-gaps of all layers are chosen to be wider than that of the active layer. In this way, these layers appear transparent to the light emitted from the active layer. By the same consideration, the substrate on which the epitaxial layer is grown should ideally have a wider band-gap. However, it is not possible to obtain AlGaAs in wafer form, and instead, the lattice-matched, visible light absorbing GaAs is commonly used as a substrate.

The AlGaAs-GaAs system can at best provide red LEDs and lasers. To obtain even shorter wavelength LEDs and lasers, such as in the orange-red or yellow part of the light spectrum, it is necessary to provide semiconductor materials with still higher band-gap energies which are capable of epitaxial growth to form the various junctions. To this end, two classes of semiconductor alloy systems have been proposed: one is non-lattice-matched and the other is lattice-matched.

In a paper by Osbourn, Biefield and Gourley, published in *Applied Physics Letters*, Vol. 41, No. 2, July 1982, pp. 172-174, there is disclosed a $GaAs_xP_{1-x}$-GaP system. This system is not lattice-matched, but the authors showed that layers can be grown with high crystalline quality if they are sufficiently thin strained-layer superlattices (SLSs) and the composition of the layers is graded. In these structures, the lattice mismatch between layers is totally accommodated by strain in the layers, so that no misfit defects are generated at the interfaces. The authors fabricated an opto-electronic device which was shown by photoluminescence studies to have an emission at a wavelength of 611 nm (corresponding to a band-gap of 2.03 eV) at a temperature of 78 K.

Since lattice matching is not required, SLSs can be grown from a wide variety of alloy systems and are consequently more flexible. Examples of other lattice-mismatched materials include GaAs-GaAsP. However, non lattice-matched systems cannot be grown as readily as lattice-matched systems, and their growth processes are generally more complex.

In the case of lattice-matched systems, it has been known that the AlGaInP-GaInP system can serve as the basis for growing higher band-gap devices. The substitution of aluminum for gallium in $Ga_yIn_{1-y}P$ has made possible the fabrication of high band-gap $(Al_xGa_{1-x})_yIn_{1-y}P$-$(Al_zGa_{1-z})_yIn_{1-y}P$ heterojunctions and quantum well heterostructures. Of these, the most important case is that of the $(Al_xGa_{1-x})_{0.5}In_{0.5}P$ alloy (y approximately equals 0.5), which (similar to $Ga_{0.5}In_{0.5}P$) is lattice-matched to GaAs and yields shorter wavelength lasers than the $Al_xGa_{1-x}As$ system. It has a large direct band-gap up to 2.26 eV (549 nm), with potential for producing an emission wavelength in the range 555 nm to 670 nm at room temperature.

However, prior works with this system where active devices composed of $(Al_xGa_{1-x})_{0.5}In_{0.5}P$ were formed directly on GaAs substrates have yielded devices with only moderately high band-gaps. Ishikawa et al, in *Applied Physics Letters*, no. 48, vol. 3, January 1986, pp. 207-208, obtained continuous (cw) room-temperature (300 K.) laser diode operation at the red wavelength of 679 nm. Among the shortest wavelength devices produced thus far is one disclosed by Kawata et al, published in *Electronics Letters*, no. 24, vol. 23, November, 1987, pp. 1327-1328. They reported a (cw) room-temperature laser at 640 nm using an $(Al_xGa_{1-x})_{0.5}In_{0.5}P$ (x=0.15) active region in a double heterostructure configuration. As for pulsed, room-temperature operation, the shortest wavelength device is disclosed by Ikeda et al in *Japanese Journal of Applied Physics*, vol. 26, 1987, pp. 101-105. They reported a pulsed, room-temperature laser at 636 nm using an $(Al_xGa_{1-x})_{0.5}In_{0.5}P$ (x=0.2) active region in a double heterostructure configuration.

The prior devices fall far short of realizing the full band-gap potential of the lattice-matched system described above. It is desirable to produce even shorter wavelength emitters by successfully growing possible higher band-gap devices under the lattice-matched system.

SUMMARY OF THE INVENTION

One main reason prior devices have not achieved the higher band-gap possible is that unlike $Al_xGa_{1-x}As$, $(Al_xGa_{1-x})_yIn_{1-y}P$ is not intrinsically lattice-matched to GaAs. The indium (In) atom is larger than the arsenide (As) atom and the phosphor (P) atom is smaller. The lattice match with GaAs is delicately maintained by balancing equal proportions of In and P atoms (i.e. y approximately equals 0.5). Prior devices have been forming the critical high band-gap device section (x approximately equals 0.4) directly on top of the GaAs substrate. However, it is not a simple matter to keep the composition y fixed during the growth process, and therefore keep strain and defects out of $(Al_xGa_{1-x})_{0.5}In_{0.5}P$ heterostructures grown on GaAs substrates.

The present invention employs a simultaneous compositional and temperature grading technique for growing epitaxial layers in a lattice-matched alloy system by Metal Organic Vapor Phase Epitaxy (MOVPE).

An additional graded layer is grown to provide a relatively defect-free transition from the substrate to the critical high band-gap device section. For example, in the case of $(Al_xGa_{1-x})_{0.5}In_{0.5}P$ heterostructures on GaAs substrates, the graded layer is divided into a number of sub-layers of different aluminum compositions and hence band-gaps. As each sub-layer is successively grown, the aluminum composition, x, increases from zero to a predetermined maximum value. In this way, the desired high band-gap, commensurate with that of the device section, is reached at the completion of the last sub-layer.

In addition, while the composition of the alloy is graded at each sub-layer, the temperature is also graded. Thus, epitaxial growth for each sub-layer is accomplished under the optimum temperature for its composition.

It is the simultaneous compositional grading and temperature increase that allows for the successful growth of the remaining high band-gap device section.

Various high band-gap devices are realizable by the technique of the invention. It includes homojunction, single heterojunction, double heterojunction devices, as well as quantum well heterostructures (QWHs). In the preferred embodiment of the invention, a high band-gap, separate-confinement QWH is formed as the device section.

QWH laser emitters produced by the techniques of the present invention have been reported by Kuo et al in a paper entitled 'Stimulated Emission in $In_{0.5}(Al_xGa_{1-x})_{0.5}P$ Quantum Well Heterostructure', given at the 4th *International Conference on MOVPE*, Hakone, Japan, May 16-20, 1988. The paper reports lasing wavelengths as short as 543 nm (pulsed), 553 nm (cw) at 77 degrees K., and 593 nm (pulsed), 625 nm (cw) at room temperature, 300 degrees K. These results represent the highest energy lasers yet reported for the $(Al_xGa_{1-x})_{0.5}In_{0.5}P$-GaAs system, or for any III-V alloy system.

In one embodiment of the invention, a high band-gap device is formed with an absorbing substrate. It includes a graded layer formed on a GaAs substrate, followed by the device section.

In another embodiment of the invention, a high band-gap device is formed with a transparent substrate. It includes a first part of a graded layer formed on a GaAs substrate, followed by a transparent substrate whose band-gap is high enough not to absorb the emission from the active device, followed by a second graded layer to bring the band-gap to the level of the device section, followed by the device section itself. The absorbing GaAs substrate and the first part of the graded layer are subsequently removed.

In yet another embodiment of the invention, a high band-gap device is also formed with a transparent substrate. It includes a transparent substrate, whose band-gap is high enough not to absorb the emission from the active device, formed on a GaAs substrate, followed by a graded layer to bring the band-gap to the level of the device section, followed by the device section itself. The absorbing GaAs substrate is subsequently removed.

In still another embodiment of the invention, an inverted transparent substrate is formed with a high band-gap device. It includes a graded layer formed on a GaAs substrate, followed by the device section, followed by a transparent substrate whose band-gap is high enough not to absorb the emission from the active device.

In still another embodiment of the invention, strained-layer superlattice structures are incorporated into either the graded layer or the device section or both.

Additional objects, features and advantages of the present invention will become apparent from the following description of a preferred embodiment thereof, which description should be taken in conjunction with the accompanying drawings.

BRIEF DESCRIPTION OF THE DRAWINGS

FIG. 1A is a schematic cross-section of an active section grown on an absorbing substrate, according to one embodiment of the present invention.

FIG. 1B is the band-gap energy diagram corresponding to the device of FIG. 1A.

FIG. 2A shows schematically the details of the QWH residing in the active section.

FIG. 2B is the band-gap energy diagram corresponding to the QWH of FIG. 2A.

FIG. 3A is a schematic cross-section of an active section with a transparent substrate, according to one embodiment of the present invention.

FIG. 3B is the band-gap energy diagram corresponding to the device of FIG. 3A.

DETAILED DESCRIPTION OF THE PREFERRED EMBODIMENT

Figure 4A:
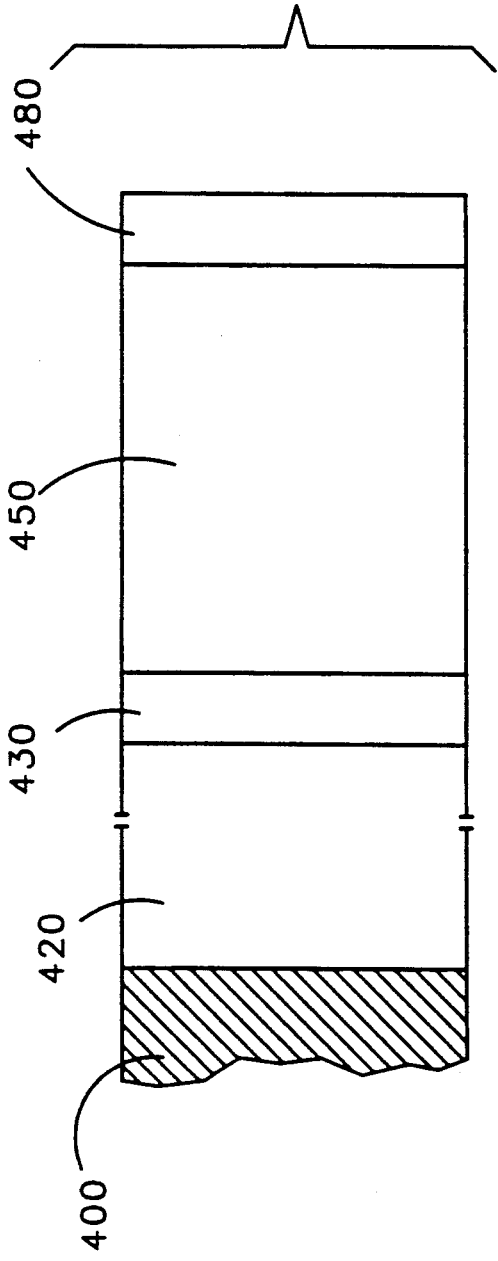
FIG. 4A is a schematic cross-section of an active section with a transparent substrate according to another embodiment of the present invention.

FIG. 1A is a schematic cross-sectional view of an active, high band-gap section grown on an absorbing substrate, according to one embodiment of the invention. Section 100 is a substrate of n-type or p-type, low dislocation, single crystal gallium arsenide (GaAs), preferably of thickness greater than 150 micrometers. A graded layer 130 of $(Al_xGa_{1-x})_{0.5}In_{0.5}P$, having a thickness preferably in the range of 0.5 to 1 micrometer, is formed over the GaAs substrate 100. The graded layer 130 has a composition of $(Al_xGa_{1-x})_{0.5}In_{0.5}P$ where x varies over the thickness of the layer from 0 to 1.0. As more gallium atoms are substituted by aluminum atoms, the band-gap energy of the $(Al_xGa_{1-x})_{0.5}In_{0.5}P$ layer 130 increases. As a 'primer' or buffer to the substrate 100, a 0.1 micrometer thin epitaxial layer of GaAs (not shown) may be optionally grown prior to the graded layer 130.

FIG. 1B illustrates the band-gap energy diagram corresponding to the device of FIG. 1A. Section 105 of the curve corresponds to the GaAs substrate with a band-gap energy of approximately 1.43 eV. Section 135 corresponds to the graded layer of $(Al_xGa_{1-x})_{0.5}In_{0.5}P$. Initially, when the concentration of aluminum is zero, the band-gap energy of $Ga_{0.5}In_{0.5}P$ is approximately 1.9 eV as shown by the point 130 on the energy curve. Towards the end of the growth, where 100% of Ga atoms are substituted by Al atoms, the band-gap energy of the graded layer has been raised to approximately 2.3 eV. This is illustrated by the point 140 on the band-gap energy curve. Referring back to FIG. 1A, an active, high band-gap device section 150 is then formed on top of the graded layer 130. Heterostructures of different band-gaps may be grown by varying the aluminum concentration, x, in $(Al_xGa_{1-x})_{0.5}In_{0.5}P$. After the device section 150 is grown, an optional contact layer 180 having an energy level 185 may be grown on top of it. In this case, it is preferably an epitaxially grown GaAs or $Ga_{0.5}In_{0.5}P$ layer of thickness 0.1 to 0.2 micrometer. Finally, ohmic contacts may be formed on the device by conventional techniques.

In the process of growing the various layers, a horizontal Metal Organic Vapor Phase Epitaxy (MOVPE) reactor is used. The MOVPE reactor is maintained at a low pressure of approximately 80 torr. The growth rate of the epitaxial layers is kept at about 0.04 micrometer per minute with a V/III ratio of 250. The epitaxial $(Al_xGa_{1-x})_{0.5}In_{0.5}P$ layers are grown lattice-matched (y approximately equals 0.5) on an n-type or p-type (100) GaAs substrate with trimethylaluminum (TMAl), trimethylgallium (TMGa), trimethylindium (TMIn), and 10% phosphine ($PH_3$) used as the sources for the primary crystal components Al, Ga, In, and P, respectively. Hydrogen selenide is used as n-type dopant source with a concentration between $5 \times 10^{17}$ to $5 \times 10^{18}$ atoms per cubic centimeter. Dimethylzinc is used as p-type dopant source with a concentration between $5 \times 10^{17}$ to $1 \times 10^{18}$ atoms per cubic centimeter.

Two factors are found to be critical to high quality crystalline growth. One is to minimize oxygen and moisture contamination; the other is to obtain a high band-gap material by grading.

The aluminum contained in the AlGaInP alloy has a high affinity for oxygen. It has been found that the consequence of oxygen contamination is heavy compensation and poor photoluminescence (PL) efficiency of the grown layer. The problem is even more acute for those high band-gap layers where the aluminum composition is high. Thus every precaution is taken to minimize oxygen and moisture contamination in the growth process. For example, the phosphine is passed through a molecular sieve filter to remove water vapor and oxygen. Reactants are carried by purified hydrogen into the horizontal reactor tube containing an RF-heated graphite susceptor. The endcap to the reactor is enclosed by a nitrogen-purged glove box to minimize oxygen contamination during substrate loading and unloading.

The other factor critical to high quality crystal growth is to keep growth defects and strains out of the lattice-matched alloy. According to the present invention, composition grading, previously employed only in non-lattice-matched systems, and temperature grading are used to produce high band-gap devices using a lattice-matched system. As mentioned in an earlier section, prior works on lattice-matched systems have been to grow a high band-gap epitaxial layer on a GaAs substrate directly in a single step. The present technique of composition grading enables devices with even shorter band-gap (625 nm), previously unattainable, to be fabricated successfully.

Figure 7:
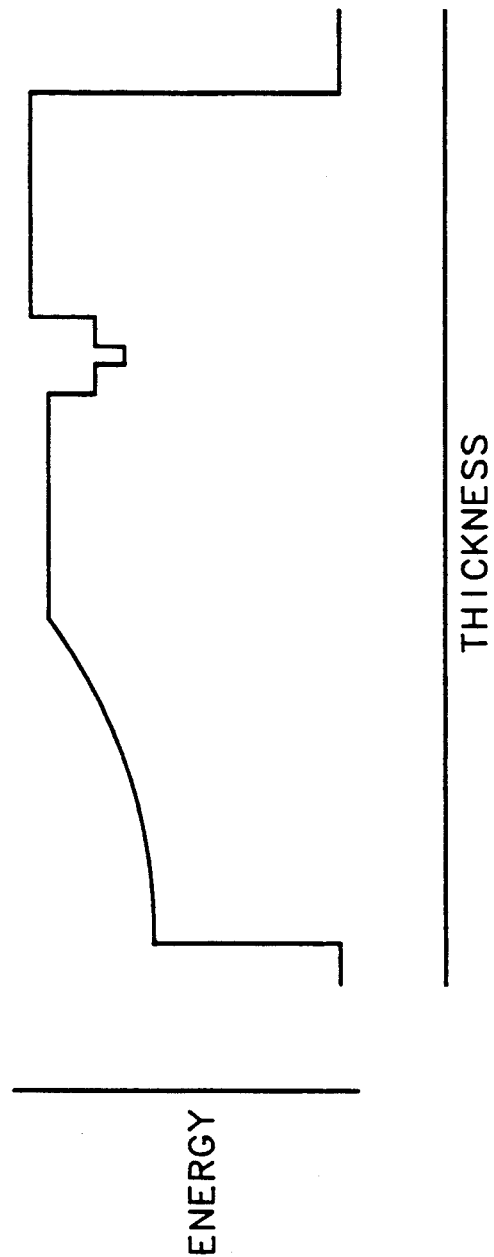
FIG. 7 is a schematic band-gap energy diagram similar to that of FIG. 1B, except the profile for the graded region is smooth.

To grow the graded layer of $(Al_xGa_{1-x})_{0.5}In_{0.5}P$, such as the layer 135 of FIG. 1A with its band-gap profile 135 in FIG. 1B, the layer is divided into a number of sub-layers. The first sub-layer has x equal to 0.0 and is composed of no aluminum, i.e. $Ga_{0.5}In_{0.5}P$, and may be regarded as a buffer layer between the GaAs and $(Al_xGa_{1-x})_{0.5}In_{0.5}P$ layers. The last sub-layer has x approximately equal to 1.0, i.e., with complete substitution of aluminum. Each of the intermediate layers has approximately equal increments in band-gap energy with corresponding variation in aluminum concentration. In the limit of division into many layers, the band-gap energy profile will be a smooth one (see FIG. 7.) In the preferred embodiment, approximately ten sub-layers are successively grown and the band-gap energy profile assumes a step-like function.

In addition, while the composition of the alloy is graded at each sub-layer, the temperature is also graded. Thus, epitaxial growth for each sub-layer is accomplished under the optimum temperature for its composition. The optimum temperature may be determined experimentally by examining the growth morphology of a sample of grown layers by techniques such as x-ray diffraction. The optimum growth temperature for the first sub-layer is found to be preferably about 690 degrees C. Similarly, the optimum growth temperature of the last sub-layer is found to be approximately 755 degrees C. These two temperatures represent the lower and higher limits respectively. In one embodiment of the invention, the optimum growth temperatures for the intermediate sub-layers may be estimated by linear interpolation of the lower and higher limits.

Apart from the graded region, the epitaxial GaAs layers are preferably grown at a temperature of approximately 690 degrees C. The remaining high band-gap device section is preferably grown at a temperature of approximately 755 degrees C. Indeed, it is the simultaneous compositional and temperature grading that provides a relatively defect-free transitional platform for the successful growth of the device section at a constant temperature of 755 degrees C.

While the description of growing the high band-gap layers has been given in the context of the $(Al_xGa_{1-x})_{0.5}In_{0.5}P$-GaAs system, it is to be understood that the techniques of the present invention are equally applicable to other lattice-matched systems.

The high band-gap active section 150 may assume any of the homostructural, heterostructural, double heterostructural and superlattice forms. In the preferred embodiment, a quantum well heterostructure (QWH) is grown as the high band-gap active section 150. The corresponding band-gap energy diagram is shown in FIG. 1B as a section 155. FIG. 2A shows in more detail a cross-section of the QWH in the active section 150 of FIG. 1A. Similarly, FIG. 2B is the detailed band-gap energy diagram corresponding to the QWH of FIG. 2A and to the section 155 of FIG. 1B.

In particular, FIGS. 2A and 2B show a separate confinement QWH. This refers to two separate sets of confining structures, one for confining carriers and the other for confining light.

The sections 161 and 162 form the high band-gap heterostructures on either side of the active device 150. They help to confine the carriers within the central active layer. Section 161 is composed of $(Al_xGa_{1-x})_{0.5}In_{0.5}P$ where x is approximately 0.9. It is n-doped and preferably grown to a thickness of approximately 1 micrometer. The section 162 is composed of p-doped $(Al_xGa_{1-x})_{0.5}In_{0.5}P$ where x is approximately 1. It is preferably grown to a thickness of 1 micrometer. The corresponding band-gap energy diagram of the carrier confinement layers 161 and 162 are shown in FIG. 2B respectively as the curves 171 and 172. They correspond to a band-gap energy in the range of 2.3 to 2.4 eV.

Referring back to FIG. 2A, the optical confinement layers are provided by layers 163 and 164. Both layers are composed of n-doped $(Al_xGa_{1-x})_{0.5}In_{0.5}P$. They are both grown to a thickness of approximately 0.1 micrometer. Their corresponding band-gap energies are shown in FIG. 2B respectively as the levels 173 and 174 which correspond to 2.25 eV.

Finally, in FIG. 2A, the active quantum well section is comprised of layer 167. The layer 167 is composed of n-doped $(Al_xGa_{1-x})_{0.5}In_{0.5}P$ where x is equal to approximately 0.2. The active layer 167 defines a quantum well with a width of approximately 0.02 to 0.04 micrometers. The corresponding band-gap energy profile is shown in FIG. 2B. The bottom of the well denoted by the level 177 is approximately 2 eV, and corresponds to the layer 167 of FIG. 2A. In the fabrication of the QWH as illustrated in FIGS. 2A and 2B, each layer is grown sequentially from left to right.

Multi-quantum-well structures and other variations of the quantum well structure such as graded-index separate confinement heterostructures (GRIN-SCH) are well-known in the art. Although only single-quantum-well structures have been shown and described, the invention is equally applicable to multi-quantum-well structures and other variations such as GRIN-SCH.

Referring back to FIGS. 1A and 1B, the QWH device shown is typically grown on a GaAs substrate. As mentioned earlier, GaAs has a band-gap which corresponds to the infrared end of the light spectrum. It is therefore highly absorptive of, and opaque to, visible light. LED devices formed on GaAs substrates thus are inherently disadvantageous in that the emitted light in the solid angles sustained by the opaque substrates, as well as light reflected by critical angle reflection at the upper surface, is lost to absorption.

It is possible to have transparent substrate LEDs, an example of which is disclosed by Ishiguro et al. in *Applied Physics Letters*, Vol. 43, No. 11, pages 1034–1036, Dec. 1, 1983. The disclosed process involves growing various transparent layers of AlGaAs on an absorbing GaAs substrate. The first transparent layer adjacent to the GaAs substrate serves as a substitute substrate and subsequent layers constitute the device. The opaque GaAs substrate is subsequently removed, leaving the device on substitute transparent substrate only.

FIG. 3A is a schematic cross-sectional view of an active section with a transparent substrate, according to another embodiment of the invention. Essentially, the initial fabrication process is similar to that of the absorbing substrate. The main difference is that during the growth of the grading layer one of the steps is very long in order to grow a transparent substrate.

Referring to FIGS. 3A and 3B at the same time, a GaAs substrate 300 with its corresponding band-gap energy level 305 may form the basis of subsequent epitaxial growth. As in the absorbing substrate case described earlier, a grading layer 320 is epitaxially grown on top of the substrate 300. Because of the grading, the band-gap energy increases as each new graded layer is grown, as shown by the energy level curve 325. For a substrate to be transparent, its band-gap energy must be higher than the characteristic emission energy of the QWH. In the present case it is close to the level 377. When the band-gap energy reaches a level higher than the minimum band-gap energy level 377 of the QWH, the grading process is halted temporarily. Thereupon a layer 330 of $(Al_xGa_{1-x})_{0.5}In_{0.5}P$ of constant aluminum concentration (x=0.35) is grown. This layer is to be served as a transparent substrate and is preferably grown to a thickness between 70 to 90 micrometers. Its band-gap level is illustrated by the level 335. This level 335 may be anywhere between the levels 377 of the QWH and the band-gap energy level 355 of the confinement layer 350. In the preferred embodiment, it is chosen to be slightly above the level 377 of the QWH so as to minimize the aluminum content in the transparent substrate 335. In this way it is less susceptible to moisture and oxidation. After the transparent substrate level 330 is grown, a second graded layer 340 is grown on top of it to form a high band-gap basis (as shown by the energy level curve 345) for the active section which follows.

The first and second graded layers 320 and 340 may be regarded as equivalent to the single graded layer 130 of FIG. 1A but split into two parts. Indeed, if the growth of a transparent substrate such as the substrate 335 is included during the growth of graded layer 130 in FIG. 1A, the resulting structures will be equivalent to the layers 320, 330 and 340 of FIG. 3A.

Referring back to FIG. 3A and FIG. 3B, after the second graded layer 340 is grown, an active, high band-gap section 350 is then grown on top of it as in the case of the absorbing substrate illustrated in FIG. 1A. Finally a layer 380 acting as a protective cap as well as a contact buffer is grown on top of the active section 350. It is most desirable for the contact layer 380 to be transparent and therefore it should have a band-gap level 385 higher than the level 377. It is preferably composed of $(Al_xGa_{1-x})_{0.5}In_{0.5}P$, where x is approximately 0.35. After all layers have been grown, any layers with band-gap lower than the level 377 of the QWH is removed. This prevents light emission from the QWH from being reabsorbed. In FIG. 3A, the absorbing layers to be removed correspond to the GaAs substrate 300 and the first part of the graded layer 320. The removal may be performed by chemical etching using a solution such as a combination of hydrogen peroxide and sodium hydroxide or hydrogen peroxide and ammonium hydroxide.

In order to achieve a good ohmic contact in some cases, the contact layer 380 may be a thin absorbing layer of $Ga_{0.5}In_{0.5}P$ (i.e. x=0). Once the metal contact is deposited (and it would not cover the entire surface of the device) the $Ga_{0.5}In_{0.5}P$ outside the area of the metal contact would be etched away, leaving a mostly transparent region.

Figure 4B:
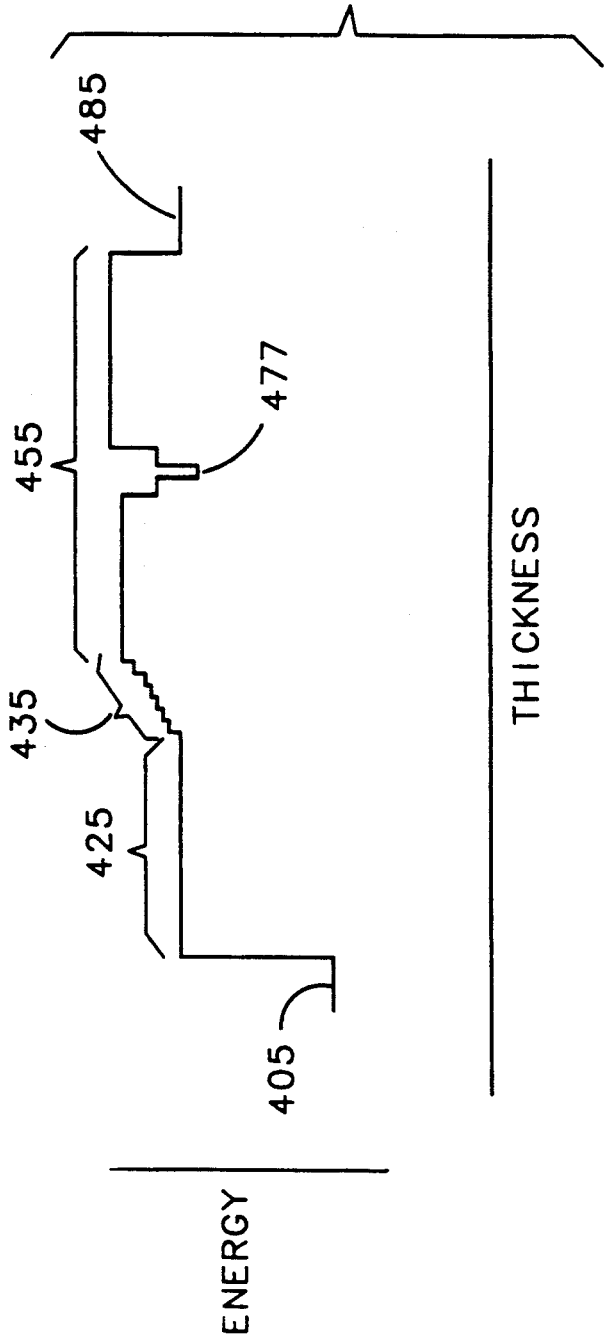
FIG. 4B is the band-gap energy diagram corresponding to the device of FIG. 4A.

FIGS. 4A and 4B refer to another transparent substrate embodiment of the invention. Again, as in the case illustrated by FIG. 3A, substrate 400 (having energy level 405) may be a high quality GaAs wafer. However, unlike that of FIG. 3A, the first part of the graded layer is omitted, and a high band-gap transparent substrate 420 is grown directly on top of the substrate 400. Again the transparent substrate must have band-gap energy level 425 higher than the band-gap energy level 477 of the QWH but lower than the band-gap energy levels 455 of the confinement layer 450 and 435 of the graded layer 430. The transparent substrate layer 420 is composed of $Al_xGa_{1-x}As$ where x is approximately 0.75. The substrate 420 is preferably grown to a thickness of 70 to 90 micrometers. It could be grown epitaxially by liquid phase epitaxy (LPE) or metalorganic vapor phase epitaxy (MOVPE). Thereafter a graded layer 430 followed by an active high band-gap section 450 and a protective cap or contact buffer 480 (at energy level 485) are grown as in the case illustrated in FIGS. 3A and 3B. After all the layers have been grown, the absorbing GaAs substrate 400 is then removed.

Figure 5A:
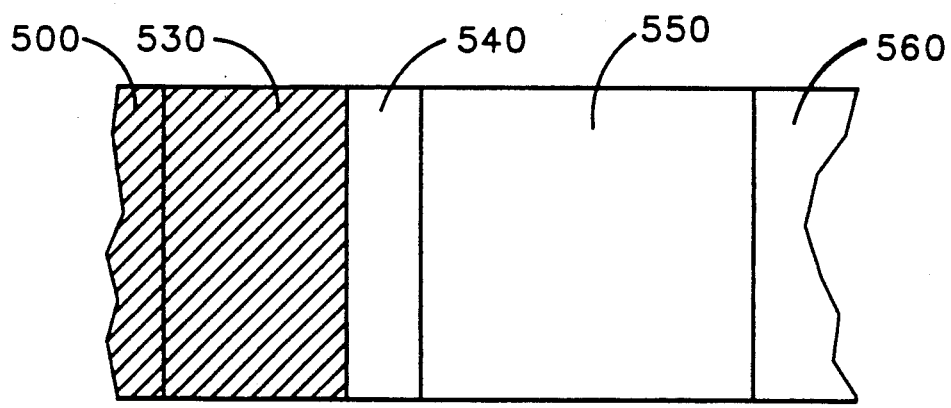
FIG. 5A is a schematic cross-section of an active section with an inverted transparent substrate according to another embodiment of the present invention.
Figure 5B:
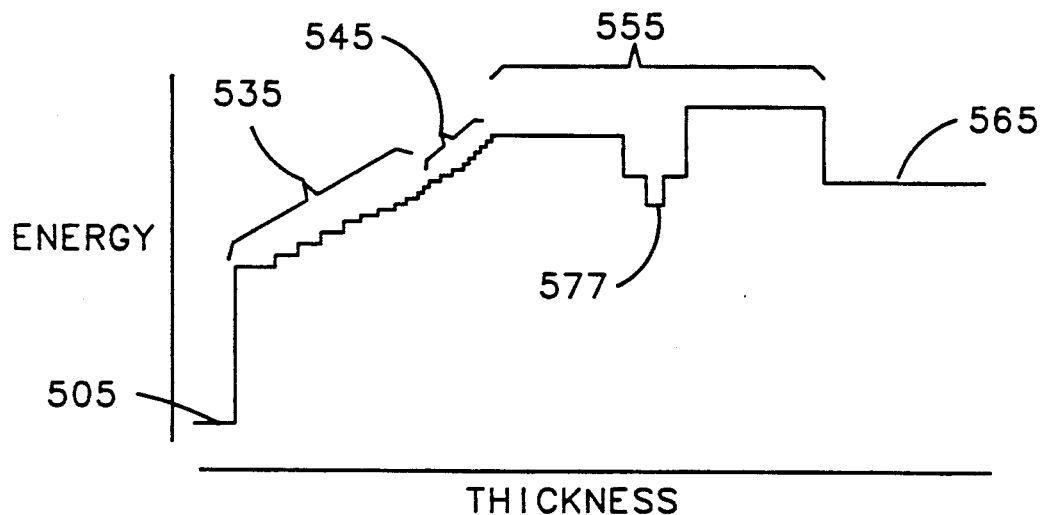
FIG. 5B is the band-gap energy diagram corresponding to the device of FIG. 5A.

FIGS. 5A and 5B refer to yet another transparent substrate embodiment of the invention. In this case, the transparent substrate 560 is grown last, particularly after the formation of the active section 550. Devices with such inverted substrate have been disclosed in a U.S. application Ser. No. 188,140 by Cook and Camras, assigned to the same assignee of the present application. Their disclosure has been given in the context of lower band-gap opto-electronic devices using the AlGaAs system. The order of growing the transparent substrate and the active device layer is reversed. The active device layer is grown first on the high quality, but absorbing GaAs substrate. Then the transparent substrate is formed on top of the active device layer. Subsequently, the absorbing GaAs substrate is removed. This enables the active device layer to be formed on a good surface, thereby ensuring consistently good crystalline quality, independent of any of the problems related to the growth of the transparent substrate.

Referring to FIGS. 5A and 5B, the growth of the absorbing substrate 500, the graded layers 530 and 540, and the active high band-gap section 550 are all similar to the absorbing substrate embodiment described in FIGS. 1A and 1B. After the formation of the active high band-gap section 550, a transparent substrate 560 is grown on top of it. The transparent substrate may either be $Al_xGa_{1-x}As$ where x is approximately 0.75 or $(Al_xGa_{1-x})_{0.5}In_{0.5}P$ where x is approximately 0.6. It is preferably grown to a thickness of 70 to 90 micrometers. Again as in the transparent substrate described earlier, its composition is chosen such that its band-gap energy level 565 is larger than the level 577 of the QWH and less than the band-gap energy level 555 of the confinement layers. Following growth and during processing, all layers which are absorbing (i.e. having band-gap levels less than the level 577 of QWH) are removed. In the case of FIG. 5A, this corresponds to the original GaAs substrate 500 and part of the graded layer 530 (corresponding to energy levels 505 and 535).

Figure 6:
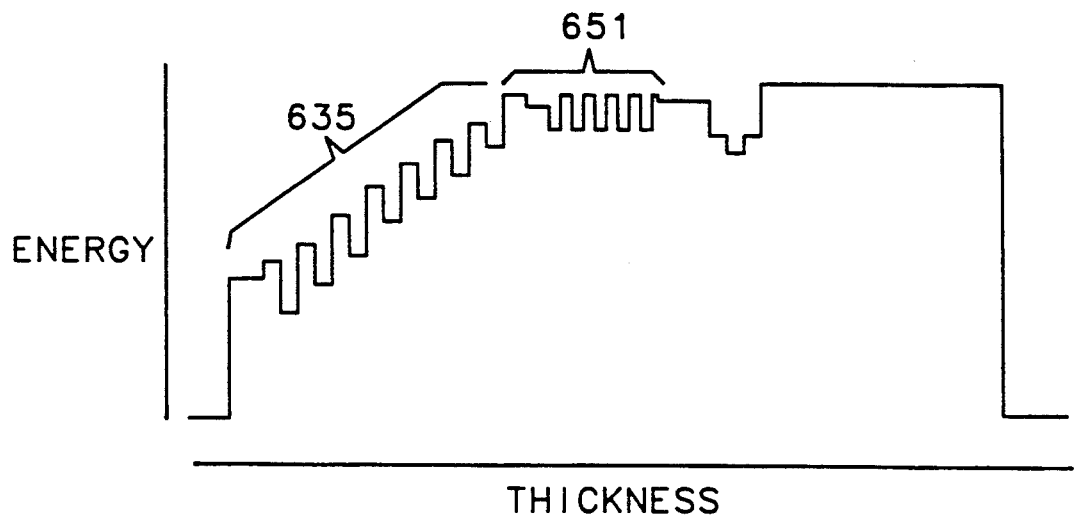
FIG. 6 is a schematic band-gap energy diagram corresponding to a device with SLS in the graded region and the cladding region.

FIG. 6 is similar to the schematic band-gap energy diagram of FIG. 1B, except with the incorporation of strained-layer superlattice (SLS) in the graded region 635 and the confinement region 651 of the active section. Lattice mismatch and strains are deliberately introduced into very thin layers (with thickness approximately equal to 0.1 to 0.2 micrometer) during the epitaxial growth of $(Al_xGa_{1-x})_yIn_yP$. The controlled introduction of strains into the epitaxial layer has the effect of accommodating the strains inherent in a material which is not perfectly lattice-matched.

Referring to FIG. 6, to incorporate the SLS structures 635 and 651, the epitaxial growth of $(Al_xGa_{1-x})_yIn_yP$ proceeds with average growth parameters the same as in the case described in FIGS. 1A and 1B. In addition, y is allowed to fluctuate slightly (about 10%) about its lattice-matched value of 0.5 on alternate layers.

For illustrative purposes, FIG. 6 has SLS structures incorporated into both the graded region 635 and the cladding region 651 of the device on an absorbing substrate. It is to be understood that incorporation of SLS structures is intended to further improve the crystalline quality when the need arises. It may be incorporated only in the graded region or in the device section or in both regions (as illustrated) or not at all. It is equally applicable to devices with transparent substrates.

Although the various aspects of the present invention have been described with respect to its preferred embodiments, it will be understood that the invention is to be protected within the scope of the appended claims.

We claim:
1. An electro-optical device comprising:
    a first substrate layer;
    a section composed of aluminum gallium indium phosphide having higher energy band gaps than the first substrate layer; and
    a second layer composed of aluminum gallium indium phosphide adjoining the section so as to form a boundary therewith, said second layer having a varying energy band gap such that an energy band gap of said second layer at the boundary substantially equals that of the section at the boundary and decreases to a lesser energy band gap away from said boundary, wherein said first substrate layer adjoins one of said section and said second layer and said first substrate layer, section and second layer are substantially lattice matched.
2. The device of claim 1, wherein said second layer adjoins the section on one side and the first substrate layer on the other.
3. The device of claim 2, wherein the first substrate layer is composed of Gallium Arsenide.
4. The device of claim 2, wherein the first substrate layer is a transparent substrate.
5. The device of claim 4, wherein the first substrate layer is composed of aluminum gallium indium phosphide.
6. The device of claim 4, wherein the first substrate layer is composed of aluminum gallium arsenide.
7. The device of claim 1, wherein the section adjoins the second layer on one side and the first substrate layer on the other, said first substrate layer being a transparent substrate.
8. The device of claim 7, wherein the first substrate layer is composed of aluminum gallium indium phosphide.
9. The device of claim 7, wherein the first substrate layer is composed of aluminum gallium arsenide.
10. The device of claim 1, wherein the energy band gap of the section is above 2 eV.
11. The device of claim 1, wherein the energy band gap of the second layer changes by steps.
12. The device of claim 1, wherein the energy band gap of the second layer changes smoothly.
13. The device of claim 1, wherein the first substrate layer and second layer have minimum energy band gaps which are larger than that of the minimum energy band-gap of the section and less than the maximum energy band-gap of the section.
14. An electro-optical device comprising:
    a first substrate layer;
    a section having higher energy band gaps than the first substrate layer and including a quantum well structure composed of doped semiconductor material to increase carrier density and light emission efficiency; and
    a second layer adjoining the section so as to form a boundary therewith, said second layer having a varying energy band gap such that an energy band gap of said second layer at the boundary substantially equals that of the section at the boundary and decreases to a lesser energy band gap away from said boundary, wherein said first substrate layer adjoins one of said section and said second layer and said first substrate layer, section and second layer are substantially lattice matched.
15. An electro-optical device comprising:
    a first substrate layer;
    a section having higher energy band gaps than the first substrate layer and a strain layer super lattice structure; and
    a second layer adjoining the section so as to form a boundary therewith, said second layer having a strain layer super lattice structure and a varying energy band gap such that an energy band gap of said second layer at the boundary substantially equals that of the section at the boundary and decreases to a lesser energy band gap away from said boundary, wherein said first substrate layer adjoins one of said section and said second layer and said first substrate layer, section and second layer are substantially lattice matched.

* * * * *